US012663239B2

(12) United States Patent
Miller et al.

(10) Patent No.: US 12,663,239 B2
(45) Date of Patent: Jun. 23, 2026

(54) ADJUSTABLE WEAPON SIGHT SYSTEM AND METHOD OF CONTROL

(71) Applicant: EOTech, LLC, Plymouth, MI (US)

(72) Inventors: Mark David Miller, Monroe, MI (US); John Anthony Bailey, Livonia, MI (US); Brian Keith Socha, Dearborn, MI (US)

(73) Assignee: EOTech, LLC, Plymouth, MI (US)

( * ) Notice: Subject to any disclaimer, the term of this patent is extended or adjusted under 35 U.S.C. 154(b) by 288 days.

(21) Appl. No.: 18/455,292

(22) Filed: Aug. 24, 2023

(65) Prior Publication Data

US 2024/0068778 A1 Feb. 29, 2024

Related U.S. Application Data

(60) Provisional application No. 63/373,479, filed on Aug. 25, 2022.

(51) Int. Cl.
F41G 1/30 (2006.01)
F41G 1/16 (2006.01)
(Continued)

(52) U.S. Cl.
CPC ................. F41G 1/30 (2013.01); F41G 1/16 (2013.01); F41G 1/545 (2013.01); G01R 33/072 (2013.01);
(Continued)

(58) Field of Classification Search
CPC ............... F41G 1/30; F41G 1/54; F41G 1/545
See application file for complete search history.

(56) References Cited

U.S. PATENT DOCUMENTS 4,713,889 A 12/1987 Santiago
8,109,024 B2 2/2012 Abst
(Continued)

FOREIGN PATENT DOCUMENTS

CA 3108899 A1 * 5/2020 ............... F41G 3/08
CN 209993291 U * 1/2020
EP 2113737 A2 * 11/2009 ............... F41G 1/34

OTHER PUBLICATIONS

Feyachi Reflex Sight RS-28 (Red and Green in one Sight!). Feyachi Outdoors. <https://www.youtube.com/watch?v=lgo5YMFRr9s>. Apr. 21, 2021. (Year: 2021).*
(Continued)

*Primary Examiner* — Gabriel J. Klein
(74) *Attorney, Agent, or Firm* — Bodman PLC

(57) ABSTRACT

An weapon sight system includes a weapon sight having body with an optical element that is configured to superimpose a reticle that is visible through the optical element. The weapon sight includes a controller in electronic communication with and configured to control a light source. The light source may include an LED for generating a reticle image on the optical element at a plurality of different brightness conditions. The light source may include an array of LEDs for generating multiple different reticle images on the optical element. The weapon sight includes a Hall effect sensor in electronic communication with the controller to adjust user-selectable settings including reticle brightness or reticle image. The weapon sight system includes a magnetic input device for providing an input to the Hall effect sensor of the weapon sight.

20 Claims, 8 Drawing Sheets

(51) Int. Cl.

| | | |
|---|---|---|
| *F41G 1/54* | (2006.01) |
| *G01R 33/07* | (2006.01) |
| *G02B 27/34* | (2006.01) |
| *G02B 27/36* | (2006.01) |
| *H05B 47/11* | (2020.01) |

(52) U.S. Cl.

CPC ............ *G02B 27/34* (2013.01); *G02B 27/36* (2013.01); *H05B 47/11* (2020.01)

(56) References Cited

U.S. PATENT DOCUMENTS

| | | | |
|---|---|---|---|
| 8,254,746 B2 | 8/2012 | Schick et al. | |
| 8,448,373 B2 | 5/2013 | Matthews et al. | |
| 9,310,173 B2 | 4/2016 | Bay | |
| 9,354,011 B2 | 5/2016 | Cooke et al. | |
| 10,001,335 B2 | 6/2018 | Patterson et al. | |
| 10,088,275 B1* | 10/2018 | Warren | F41G 1/02 |
| 10,345,587 B1* | 7/2019 | Loebig | G03H 1/0005 |
| 10,401,136 B1 | 9/2019 | Vantassell et al. | |
| 10,477,618 B2 | 11/2019 | Downing | |
| 10,921,091 B2* | 2/2021 | Borrico | F41G 1/30 |
| 11,428,503 B1* | 8/2022 | Mauricio | G02B 23/16 |
| 11,822,413 B1* | 11/2023 | Owens | G06F 1/3231 |
| 2002/0078618 A1* | 6/2002 | Gaber | F41G 1/30 |
| | | | 42/123 |
| 2009/0193705 A1* | 8/2009 | LoRocco | F41G 1/30 |
| | | | 42/123 |
| 2010/0091485 A1* | 4/2010 | Matthews | F21L 4/027 |
| | | | 362/234 |
| 2010/0242332 A1* | 9/2010 | Teetzel | F41A 23/22 |
| | | | 42/72 |
| 2012/0186132 A1 | 7/2012 | Matthews et al. | |
| 2013/0033746 A1* | 2/2013 | Brumfield | G02B 23/105 |
| | | | 359/422 |
| 2013/0193645 A1 | 8/2013 | Kazakov et al. | |
| 2013/0199073 A1* | 8/2013 | Jung | F41G 1/00 |
| | | | 42/113 |
| 2013/0283660 A1* | 10/2013 | Matthews | F41G 1/26 |
| | | | 42/118 |

| | | | |
|---|---|---|---|
| 2013/0333266 A1* | 12/2013 | Gose | G01J 1/0219 |
| | | | 348/340 |
| 2014/0008435 A1* | 1/2014 | Sun | F41G 3/08 |
| | | | 235/407 |
| 2014/0290114 A1* | 10/2014 | Thomas | G02B 23/10 |
| | | | 42/119 |
| 2015/0184978 A1* | 7/2015 | Hedeen | F41G 1/35 |
| | | | 42/114 |
| 2015/0276349 A1* | 10/2015 | Northrup | F41G 3/26 |
| | | | 434/22 |
| 2016/0033221 A1* | 2/2016 | Schmehl | F41A 33/00 |
| | | | 42/90 |
| 2016/0061549 A1* | 3/2016 | Patterson | F41A 19/12 |
| | | | 42/69.01 |
| 2016/0102943 A1* | 4/2016 | Teetzel | F41G 1/35 |
| | | | 42/113 |
| 2016/0231083 A1* | 8/2016 | Regan | F41G 3/06 |
| 2017/0154521 A1 | 6/2017 | Zamorano-Larrate | |
| 2018/0106568 A1 | 4/2018 | Hedeen et al. | |
| 2018/0306553 A1* | 10/2018 | Denk | F41G 1/35 |
| 2018/0313633 A1* | 11/2018 | Delz | G01B 7/30 |
| 2018/0328686 A1* | 11/2018 | Hofleitner | E05B 47/0038 |
| 2019/0212091 A1* | 7/2019 | Fulton | F41B 5/12 |
| 2019/0244771 A1* | 8/2019 | Nobes | F41G 11/001 |
| 2019/0324260 A1* | 10/2019 | Hamilton | F41G 1/38 |
| 2020/0041228 A1* | 2/2020 | Hofmann | F41G 1/38 |
| 2020/0232759 A1* | 7/2020 | York | F41G 1/30 |
| 2020/0232762 A1 | 7/2020 | Hamilton et al. | |
| 2021/0055536 A1 | 2/2021 | Deangelis | |
| 2021/0207928 A1 | 7/2021 | Brewer et al. | |
| 2021/0239302 A1 | 8/2021 | Galli et al. | |
| 2021/0348886 A1 | 11/2021 | Havens et al. | |
| 2022/0341702 A1* | 10/2022 | Owens | F41A 17/06 |
| 2023/0175813 A1* | 6/2023 | Sabaldan Elpedes | F41G 3/08 |
| | | | 42/113 |
| 2025/0289152 A1* | 9/2025 | Kossett | B25J 19/027 |

OTHER PUBLICATIONS

International Search Report for Application No. PCT/US2023/072831; mailed Feb. 21, 2024; 4 pp.

* cited by examiner

ADJUSTABLE WEAPON SIGHT SYSTEM AND METHOD OF CONTROL

CROSS-REFERENCE TO RELATED APPLICATIONS

This application claims priority under 35 U.S.C. § 119(e) to U.S. Provisional Patent Application No. 63/373,479, filed Aug. 25, 2022, the disclosure of this prior application is considered part of this application and is hereby incorporated by reference in its entirety.

TECHNICAL FIELD

The present disclosure relates to imagers and optics for weapon systems, and more particularly to adjustable systems used in or integrated with reflected or holographic optical sights, such as on weapons or weapon systems.

BACKGROUND

Firearms and other hand-held weapons, such as bows, are commonly provided with optical sights that provide a targeting reticle within a user's field of view to aid in aiming the weapon. Conventional sporting/combat optical sights often use reflected or holographic optics that, when viewed through a glass optical window, superimpose the appearance of a reticle in the field of view. The image of the reticle may be illuminated by a laser diode or other light emitting device and is disposed to appear aligned parallel to and spaced a relatively short vertical distance from the barrel or aiming axis of the firearm upon which the sight is mounted.

Conventional weapon sight systems have included multiple user-selectable operational adjustments, such as selecting the appearance of the reticle image. Known reticle patterns include center dots, crosshairs, circles, posts and combinations thereof. Other user-selectable adjustments may include brightness values. Conventional weapon sights may include static brightness adjustments, or auto-dimming adjustments that react to ambient lighting conditions. Yet further user-selectable adjustments may include reticle color. Conventional weapon sights using reflected or holographic reticles may illuminate the reticle image using red light, green light or other color.

Facilitating the user input to cycle or toggle user-selectable adjustments in conventional systems has required the inclusion of buttons, switches, levers or other controls that require minimum sizes to be reasonably accessible, additional components, more moving parts and additional penetrations through a housing wall that may allow moisture or debris to ingress into the sight. The accessibility of controls disposed on the exterior of a weapon sight also introduces the opportunity to unintentionally interact with the control accidentally. It is therefore desirable to provide a weapon sight and method of operating a weapon sight that provides for user input to cycle or toggle user-selectable adjustments that overcomes the shortcomings of the prior art.

SUMMARY

The following section provides a general description and is not intended to be a comprehensive disclosure of the full scope of all features in various combination. In a first aspect, a weapon sight includes a body, a controller enclosed within the body, and a power source in electronic communication with the controller and enclosed within the body. The weapon sight includes a light source in electronic communication with and controlled by the controller, and the light source is disposed within the body and operable to generate a reticle image. The weapon sight includes a frame extending from the body, and an optical element within the frame. The optical element is arranged to visually display the reticle image. The weapon sight includes a Hall effect sensor in electronic communication with the controller. The Hall effect sensor is arranged to generate an input signal in response to a magnet being disposed in proximity to the Hall effect sensor. The controller is operable to adjust a user-selectable setting associated with the reticle image in response to receiving the input signal generated by the Hall effect sensor.

The weapon sight may further include an ambient light sensor in electronic communication with the controller. The ambient light sensor is arranged to generate a brightness signal representative of an ambient light condition. The controller is arranged to control a brightness of the light source based on the signal generated by the ambient light sensor. The controller may include a memory device storing a plurality of user-selectable brightness profiles; the controller being operable to adjust among the plurality of user-selectable brightness profiles based on the input signal; and wherein the reticle image is based on a combination of a one of the user-selectable brightness profiles and the brightness signal. The plurality of user-selectable brightness profiles may include a first brightness profile for use under natural sunlight, a second brightness profile for use indoors, and a third brightness profile for use in low-light conditions.

The weapon sight may include a user-selectable setting that includes a reticle design. The controller may include a memory device storing a plurality of user-selectable reticle designs. The user-selectable reticle designs may include a dot, a starburst, a crosshair with center dot, a circle with center dot, stadia lines, and combinations thereof.

In the weapon sight, the Hall effect sensor may be disposed adjacent an internal surface of a side wall of the body. The Hall effect sensor may be disposed on a side of the frame.

In a second aspect, a weapon sight system includes a weapon sight. The weapon sight includes a body, a controller enclosed within the body and a light source enclosed within the body. The light source is in electronic communication with the controller. The controller is arranged to control the light source to generate a reticle image. The weapon sight includes a Hall effect sensor disposed within the weapon sight and in electronic communication with the controller. The weapon sight includes a recess formed on the body proximate the Hall effect sensor.

The weapon sight system also includes a magnetic input tool. The magnetic input tool includes a tip shaped to correspond to the recess. The tip includes a magnet. The Hall effect sensor is arranged to generate an input signal when the tip of the magnetic input tool is received in the recess. The controller is operable to adjust a user-selectable setting associated with the reticle image in response to receiving the input signal generated by the Hall effect sensor.

The weapon sight system may include an ambient light sensor in electronic communication with the controller. The ambient light sensor may be arranged to generate a brightness signal representative of an ambient light condition. The controller may be arranged to control a brightness of the light source based on the signal generated by the ambient light sensor.

In the weapon sight system, the controller may include a memory device storing a plurality of user-selectable brightness profiles. The controller may be operable to adjust among the plurality of user-selectable brightness profiles based on the input signal. The reticle image may be based on a combination of a one of the user-selectable brightness profiles and the brightness signal.

The user-selectable setting of the weapon sight may include a reticle design. The controller may include a memory device storing a plurality of user-selectable reticle designs. The plurality of user-selectable reticle designs may include a dot, a starburst, a crosshair with center dot, a circle with center dot, stadia lines, and combinations thereof.

In the weapon sight system, the magnetic input tool may include a stylus. The tip of stylus may be a first tip and the magnet may be a first magnet at a first orientation. The stylus may include a second tip, where the second tip may include a second magnet at a second orientation, different from the first orientation.

In the weapon sight system, the weapon sight may include a second Hall sensor. The weapon sight may further include a second recess in a wall of the body proximate the second Hall effect sensor. The second tip of the stylus may be shaped to correspond to the second recess. The second Hall effect sensor may be arranged to generate a second input signal when the second tip of the magnetic input tool is received in the second recess. The controller may be operable to adjust the user-selectable setting associated with the reticle image in response to receiving the second input signal generated by the second Hall effect sensor, different from the first input signal.

In a third aspect, a method for controlling a weapon sight having a Hall effect sensor is provided. The method includes generating, by a controller in electronic communication with a light source, a first reticle image at an optical element. The first reticle image has a first reticle design, a first brightness profile, a first azimuth setting and a second elevation setting. The method includes receiving, by the controller, an input signal generated by the Hall effect sensor. The input signal represents a user input presenting a magnet in proximity to the Hall effect sensor. The method includes adjusting, by the controller, a user-selectable setting in response receiving the input signal generated by the Hall effect sensor. The user-selectable setting is one of: a brightness profile setting, a reticle design setting, an azimuth adjustment setting, an elevation adjustment setting, or combinations thereof. The method includes generating, by the controller, a second reticle image, different from the first reticle image by the adjusted user-selectable setting.

The method may further include receiving, by the controller, a mode signal to toggle an adjustment mode for adjusting the user-selectable setting. The input signal may be based on a first swipe type and the mode signal may be based on a second swipe type. The Hall effect sensor may be a first Hall effect sensor for generating the input signal, and the weapon sight may include a second Hall effect sensor for generating the mode signal. The method may further include generating, with the controller, an input confirmation. The input confirmation may include one of a visual alert, an audible alert, and combinations of a visual alert and an audible alert.

Each of the above independent aspects of the present disclosure, and those aspects described in the detailed description below, may include any of the features, options, and possibilities set out in the present disclosure and figures, including those under the other independent aspects and may also include any combination of any of the features, options and possibilities set out in the present disclosure and figures.

The details of one or more implementations of the disclosure are set forth in the accompanying drawings and the description below. Other aspects, advantages, purposes, and features will be apparent upon review of the following specification in conjunction with the drawings.

BRIEF DESCRIPTION OF THE DRAWINGS

Like reference numerals indicate like parts throughout the drawings.

DETAILED DESCRIPTION

Figure 1:
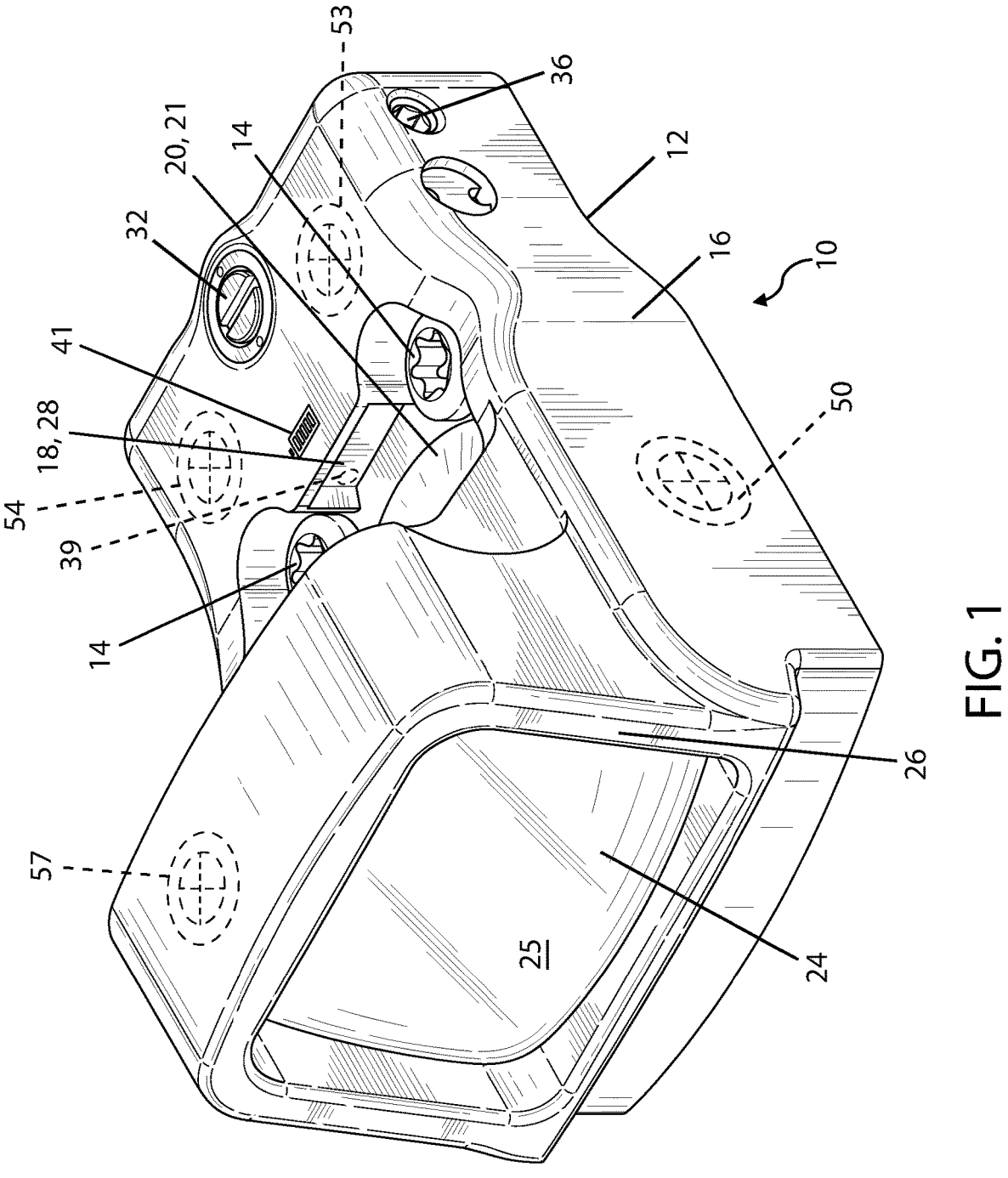
FIG. 1 is a first side perspective view of a weapon sight according to the present disclosure.

Referring now to the drawings and the illustrative examples depicted therein, a weapon sight 10 is shown in FIGS. 1-4 that can be used for sporting or combat weapons that require aiming by the operator, such as a hand held weapon capable of shooting a projectile. The term "hand held" when used in reference to the weapon includes, for example, a rifle, a shotgun, a handgun, a pistol, a bow, or any other weapon commonly used in a hand held manner. The weapon (not shown) includes a barrel or other projectile containment mechanism that defines a projectile axis. To assist with aiming the projectile axis at a target, the weapon may include fixed sights, such as iron sights, that have markers optically aligned with the projectile axis of the weapon. Also, the weapon may include a rail, such as a Weaver or Picatinny rail, which extends at least partially along the upper surface of the barrel for mounting optical sights and devices, among other weapon accessories. The rail may further extend along an upper surface of the receiver, frame, grip, or other portion of the weapon. Alternatively, the receiver, frame, rail, or other portion of the weapon may include a flat top surface having one or more threaded holes for receiving a correspondingly threaded fastener, such as, for example, a delta point footprint.

A weapon sight 10, as shown in FIG. 1, is an optical sight that superimposes a marker or reticle design (shown in FIGS. 6A-6H) in a user's field of view to aid in aiming a weapon. The weapon sight 10 includes a base 12 that is configured to mount to the weapon, such as with a mounting mechanism attached to the rail, or via threaded fasteners 14. Various types of mounting mechanisms may be employed depending upon the type of weapon and rail system. The weapon sight 10 also includes a body 16 that houses a light source 18, a power source 20, a controller 38, and an optical element 24, among any other optical or electronic components of the weapon sight 10. The body 16 may be sealed against the external environment to protect the components enclosed within the body 16.

The optical element 24 has a front surface 25 facing the target and a rear surface 27 viewed by the user during operation. Both the front surface 25 and the rear surface 27 may be aspherical surfaces, or may be spherical surfaces. The optical element 24 is mounted in a generally vertical orientation relative to the operating orientation of the weapon, held in place by a frame 26. In the illustrated weapon sight 10, the body 16 is formed integrally with the frame 26 where the frame is extending substantially perpendicularly from the body 16. The body 16 and the frame 26 may be formed of plastic material, metal material or any other suitable material formed by conventional manufacturing methods to have sufficient strength and dimensional stability to maintain the weapon sight 10 with consistent calibration during operation, which may entail significant impact and vibration forces.

The light source 18 is arranged within the housing body 16 to emit light incident upon the optical element 24, which includes a reflective surface or material to reflect the illumination to be viewable by the user. In an alternative implementation, the optical element includes a hologram to generate an image reflection. The reflected illumination creates an aiming reticle image for the user to align with an objective target viewed through the optical element 24. The optical element 24 optically displays the reticle image via the reflection from the light source 18. The light source 18 may be a light emitting diode (LED) and may be arranged to emit light directed at the optical element 24 either directly or through one or more additional optical elements, such as a rear optical element 28 disposed between the light source 18 and the optical element 24. For example, the rear optical element 28 may be assembled to the body 16 to enclose and protect the light source 18. In one example implementation, the light source 18 and the rear optical element 28 may be mechanically integrated and secured to the body 16 to provide a sealed enclosure of the body 16. In other alternatives, a plurality of rear optical elements 28 are provided to redirect, focus, or collimate the emitted light internal to the body 16 before exiting through a flat lens and reaching the optical element 24.

The light source 18 or the rear optical element 28, or a combination thereof, may be adjustable relative to the optical element 24. In the illustrated weapon sight 10, the light source 18 is supported on an adjustable carrier (not shown). The carrier may be adjusted by rotating an azimuth adjustment screw 30 (shown in FIG. 2) to laterally adjust the placement of the reticle image on the optical element 24 and an elevation adjustment screw 32 to vertically adjust the placement of the reticle image on the optical element 24. The azimuth and elevation adjustments allow the weapon sight 10 to be specifically calibrated to different weapons or different users by adjusting the location of the sighting image within the optical element 24. Once calibrated, the adjustment can be locked into place via locking screws 34, 36.

The light source 18 is in electronic communication with and controlled by the controller 38. The controller 38 is powered by the power source 20, disposed within the body 16 beneath a battery cover 21 and in electronic communication with the controller 38. The controller 38 comprises a processor, such as a microprocessor 40, and a memory device 42 storing instructions for execution by the processor. The controller 38 may include LED driving electronics 43 in communication with the microprocessor 40. The microprocessor 40 generates a signal received by the LED driving electronics 43 according to the stored instructions of the memory device 42. The controller 38 may be in communication with or may include other electronic components, such as a motor controller, where the elevation, azimuth, or both adjustments are motor controlled. The controller 38 may be in communication with or may include a wireless communication device 44, such as a Bluetooth device, near-field communication (NFC) device, radio frequency identification (RFID) device, or the like.

As described above, the light source 18 may include an LED, or alternatively may comprise an array of multiple LEDs or other light emitting devices. The signal generated by the microprocessor 40 may cause the LED driving electronics 43 to power on one or more LEDs of the light source 18 at a predetermined brightness. The predetermined brightness may be associated with a variable power level provided by the LED driving electronics 43 to the light source 18. One example weapon sight system having an automatic brightness adjustment is provided in U.S. Pat. No. 5,483,362, entitled Compact Holographic Sight, the entirety of which is herein incorporated by reference.

The controller 38 may include or may be in electronic communication with an ambient light sensor, photodetector, or other input device to determine light conditions in the surrounding environment, and particularly ambient light conditions from the direction of the target. The ambient light sensor 39 may be arranged within the body 16, for example, behind the rear optical element 28. The memory device 42 may store instructions for modulating the brightness in response to environmental light conditions. The brightness adjustment may be characterized as a defining a profile of brightness values for respective ambient light values.

The weapon sight 10 may store multiple user-selectable brightness profiles associated with different light conditions. An exemplary illustration of multiple user-selectable brightness profiles is provided in FIG. 5. For example, a first brightness profile $P_1$ may be intended for use outdoors under natural sunlight; and a second brightness profile $P_2$ may be intended for indoor use. A third brightness profile $P_3$ may be provided for use in low-light or night operation. The brightness profiles associate different levels of power to the light source generating the reticle image in different levels of ambient light in the environment. In lower light environments, it may be desirable to have lower light output from the light source in generating the reticle image, and in brighter environments, it may be desirable to have higher light output from the light source. Different brightness profiles may be preferred for different shooting environments, such as intended for self-defensive use, sporting settings, or competition settings. Each of the different brightness profiles may be defined having different brightness values for a given ambient light condition value indicated by the signal generated by the ambient light sensor 39 and processed by the controller 38, depending on the selected brightness profile $P_1$, $P_2$, $P_3$.

Figure 5:
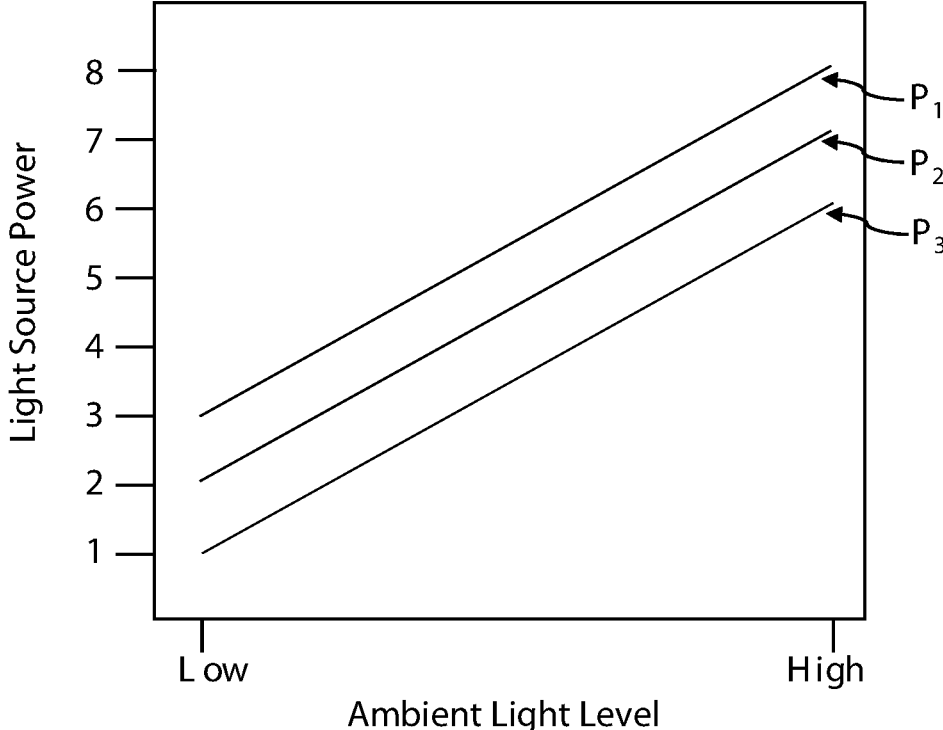
FIG. 5 is a chart illustrating exemplary user-selectable brightness profiles for use in an automatic dimming function.

While the exemplary illustration in FIG. 5 shows a step-wise offset between the different brightness profiles, this is not intended to be limiting and other relationships between brightness profiles are contemplated within the scope of the present disclosure. For example, in a brightness profile intended for low-light or night operation, experiencing high ambient light conditions may require greater output from the light source such that the brightness profile $P_3$ may have steeper slope relative to other brightness profiles. Similarly, for a brightness profile $P_1$ intended for high light environments, such as outdoor daytime operation, there may be little different between output levels at high ambient light levels and low ambient light levels, such that the slope of the brightness profile is shallow relative to other brightness profiles.

Figures 6A, 6B, 6C, 6D, 6E, 6F, 6G, 6H, 7, 8:
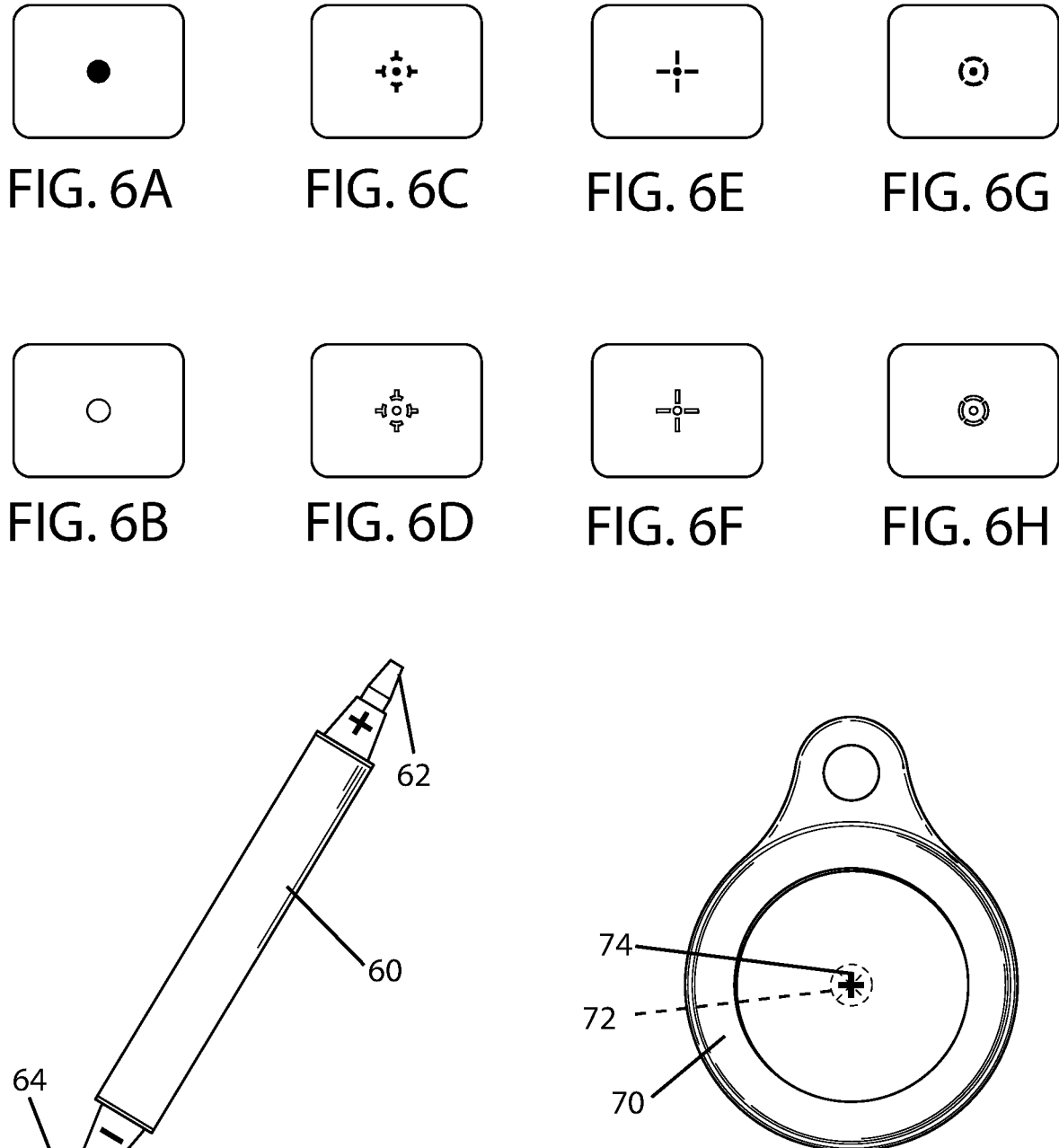
FIGS. 6A-6H are reticle designs at high and low display intensities.
FIG. 7 is a first exemplary magnetic input tool as a stylus for use with the weapon sight of the present disclosure.
FIG. 8 is a second exemplary magnetic input tool as a fob for use with the weapon sight of the present disclosure.

The light source 18 may include an array of LEDs to generate different reticle designs. FIGS. 6A-6H illustrates reticle designs at different brightness intensities. The reticle image may be generated by dedicated LED of the array of LEDs. For example, the light source 18 may include a first LED for generating a reticle design as illustrated in FIG. 6A and a separate LED for generating a reticle design as illustrated in FIG. 6C. In other alternatives, the light source 18 may comprise a single LED source and an array of masks, such as a mask wheel, which is disposed between the light source 18 and the optical element 24 for restricting the light reaching the optical element 24 generating the reticle design. Example reticle designs include a dot (FIGS. 6A-6B); starburst (FIGS. 6C-6D); crosshair with center dot (FIGS. 6E-6F); and circle with center dot (FIG. 6G-6H). The reticle designs may be generated with a higher intensity (for example, FIG. 6A) or lower intensity (for example, FIG. 6B) by varying the brightness of the light source 18. The reticle images may be rendered at the optical element 24 in red light or in green light, and the light source 18 may include separate LED elements for each reticle design in each color.

In an alternative implementation, the azimuth or elevation adjustment, or both, may be facilitated by the controller 38. The weapon sight 10 may include one or more servo motors or other actuators in electronic communication with and controlled by the controller 38 for adjusting the position of the light source 18 or the rear optical element 28. One example weapon sight including a motor for adjusting the aiming image position is provided in U.S. Pat. No. 7,225, 578 B2, entitled Aiming Sight Having Fixed Light Emitting Diode (LED) Array And Rotatable Collimator, the entirety of which is herein incorporated by reference.

The weapon sight 10 includes one or more Hall effect sensors 50 in electronic communication with the controller 38 for providing user input to the controller 38. The Hall effect sensor 50 acts to detect the presence and magnitude of a magnetic field. Disposing the Hall effect sensor 50 within the body 16 allows the user to provide input to the controller 38 without the need for buttons, or other inputs that include moving parts and openings through the walls or surfaces of the body 16. Moreover, the absence of external physical buttons avoids the possibility of an accidental or unintentional input. For example, when the weapon sight 10 is used with a compact weapon, such as a semiautomatic pistol, the weapon sight 10 may be installed on the slide mechanism in close proximity to where the slide is gripped when being pulled back to load the weapon. Having buttons on an external side of the weapon sight 10 increases a risk of unintentional activation of the button.

Presenting a magnet within the range of the Hall effect sensor 50 causes the sensor 50 to generate a signal representative of a polarity and a strength of the magnetic field. The controller 38 may be programmed to react to a signal representing the presence, polarity, magnitude, or rate of change of the magnetic field by adjusting one or more of the user-selectable features or operations of the weapon sight, including cycling between available brightness profiles, reticle image styles or colors, or adjusting the position of the reticle image on the optical element 24. In one example, the controller 38 may be programmed to selectively display different reticle elements based on a user input received via the Hall effect sensor 50, such as a center dot, circular elements, stadia marks, or the like. Various reticle elements are illustrated in FIGS. 6A-6H, which are intended to illustrative embodiments and are not intended to be limiting. In another example, the controller 38 may be programmed to select different brightness curves, brightness curve calibration offsets, or manual brightness values disabling the automatic dimming function based on the user input. The controller 38 may be programmed to select different automatic shutoff delay durations based on a user input.

In one alternative, or in combination with the prior description, the controller 38 may be programmed to display additional information, not typically displayed during operation, in response to a signal from a sensor 50 responsive to a user input. For example, the controller 38 may cause a battery state to be determined and displayed. A multi-segment LED 41 may be illuminated in response to a user input detected by the sensor 50, where a portion of the segments are illuminated reflective of a relative charge state of the power source 20. The multi-segment LED 41 may be directly viewable at a location on the body 16. Alternatively, the multi-segment LED 41 may be arranged to project light onto the optical element 24, viewable by the user when looking through the sight. The battery charge state may be displayed in different ways, such as by flashing the reticle, or momentarily adjusting the reticle brightness to indicate the level of battery charge. In one example, the reticle may flash one time for low battery state, two times for medium battery charge and three times for high battery charge. In another example, the reticle may be momentarily illuminated in a high, medium or low brightness state to indicate a high, medium or low battery charge state. In further examples, the battery charge state may be represented in four, five, or other number of gradations.

Other functions of the weapon sight 10 may be associated with an input received via the Hall effect sensor 50. The user input may toggle the on/off operation an emergency over temperature shutdown operation, or may be used to select among a series of temperature thresholds stored in the memory device 42. The user input may be used to select among pre-programmed temperature compensation offset values of the brightness curves utilized in the automatic dimming of the reticle illumination. The controller 38 may include a temperature sensor, in electronic communication with the microprocessor 40 for providing value inputs representative of an ambient environmental temperature, an operating temperature of the weapon sight 10 within the body 16, an operating temperature of the microprocessor 40, or other temperature information.

The controller 38 may be configured to toggle the weapon sight 10 into different operational modes upon receiving an input via the Hall effect sensor. The controller 38 may be configured to activate an emergency signal mode where the reticle is flashed in a timed series of short and long flash duration to signal an S.O.S. in light pulses. The controller 38 may be configured to active a self-destruct feature whereby the power source is discharges through the electronics in a way to compromise or destroy the memory device 42 or the microprocessor 40, or some other destructive operation. The controller 38 may include a wireless communication device 44 for data connectivity, such as via Bluetooth, for wirelessly receiving programming updates to the information stored on the memory device 42, for adding or changing different brightness values or other settings. The controller 38 may be configured to toggle the wireless connectivity function of the weapon sight 10, such as, for example, by setting the device into a pairing mode upon receiving a user input via the Hall effect sensor.

FIGS. 1-4 illustrate possible locations for positioning one or more Hall effect sensors 50. Difference combinations of the illustrated alternatives are possible within the scope of this disclosure, and still further alternatives are contemplated. In FIG. 1, a first sensor 50 is disposed adjacent an interior surface of a side wall of the weapon sight 10. In one alternative, the weapon sight 10 may include a single sensor 50. In an implementation having a single sensor 50, the controller 38 may be programmed to cycle between available user-selectable options upon receiving a signal from the sensor 50 indicating the presence of a magnet within range of the sensor 50. The controller 38 may respond to the sensor signal regardless of the polarity of the magnet presented within the range of the sensor 50. Where controller 38 is arranged to control the brightness profile setting based on the sensor input, the controller 38 may incrementally index the active brightness profile between the available profiles in series upon each signal indicating the presence of a magnetic input sensed by the sensor 50. The controller 38 may be programmed to provide a feedback response upon successful input at the sensor 50, for example, by flashing the reticle image a number of times associated with a brightness profile index. In other alternatives, the feedback response may include an audible alert, or a visible alert unassociated with the reticle image, for example, via an LED indicator that is either visible in the optical element 24 or disposed elsewhere on the body 16.

The single sensor 50, as shown in FIG. 1, may be arranged to generate different signals depending on whether the magnet is presented proximate the sensor 50 with a positive polarity or a negative polarity. The controller 38 may therefore be programmed to provide a first response to a first polarity magnetic field and to provide a different, second response to a second polarity magnetic field. For example, the controller 38 may increment through a series of brightness profiles when presented with the first polarity magnetic field and decrement oppositely through the series of brightness profiles when presented with the second polarity magnetic field.

Figure 2:
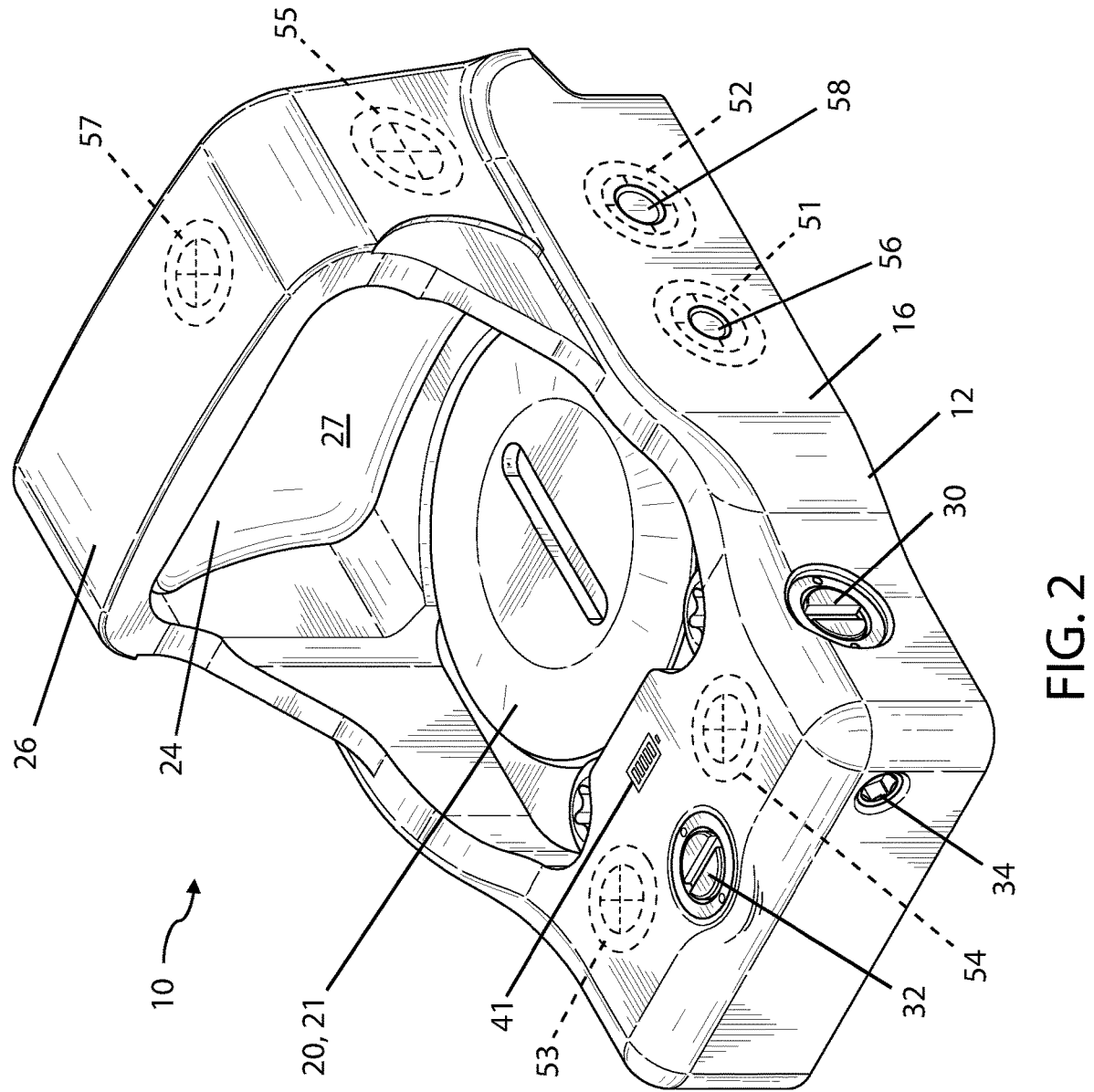
FIG. 2 is a second side perspective view of the weapon sight according to the present disclosure.

FIG. 2 illustrates a second alternative having two sensors 51, 52 arranged on a side of the body 16. As a further alternative for sensor placement, one or more sensors 55 may be disposed on one or both sides of the frame 26. The controller 38 may be programmed to respond to the two sensors differently, for example, with one sensor 51 associated with a brightness profile selection, and the second sensor 52 associated with a reticle design selection. In this example, both sensors 51, 52 may cycle through available options in one sequential direction in the presence of the first polarity and in an opposite direction in the presence of the second polarity.

In another alternative, both sensors 51, 52 may be associated with a single feature selection, either brightness or reticle design. In this example, one sensor 51 is responsive to the first polarity, and the second sensor 52 is responsive to the second polarity. The controller 38 may be programmed to read the sensor signal as an input only based on a minimum signal strength threshold associated with the particular polarity presented in close proximity to the one or the other sensor 51, 52. The sensors 51, 52 may be spaced apart along the side of the body 16, and may include magnetic shielding material disposed between the sensors 51, 52 to minimize the occurrence of an unintentional input.

In a further alternative, the weapon sight 10 may include a first sensor 50 on a first side of the body 16 and two additional sensors 51, 52 on a second side of the body 16 opposite the first side. The controller 38 may be programmed to take inputs from the two sensors 51, 52 to change values of a user-selectable feature, and take input from the first sensor 50 to cycle between available user-selectable features. For example, a user may present a magnet in proximity to the first sensor 50 to activate a first adjustment mode of reticle brightness profiles, and then present the magnet in proximity to the second sensor 51 to cycle through available brightness profiles in a first sequence. Presenting the magnet in proximity to the third sensor 52 cycles through available brightness profiles in a second, opposite sequence. Presenting the magnet in proximity to the first sensor 50 a second time activates a second adjustment mode for reticle design selection. The user can then present the magnet in proximity to the second and third sensors 51, 52 to cycle between available reticle designs.

Figure 3:
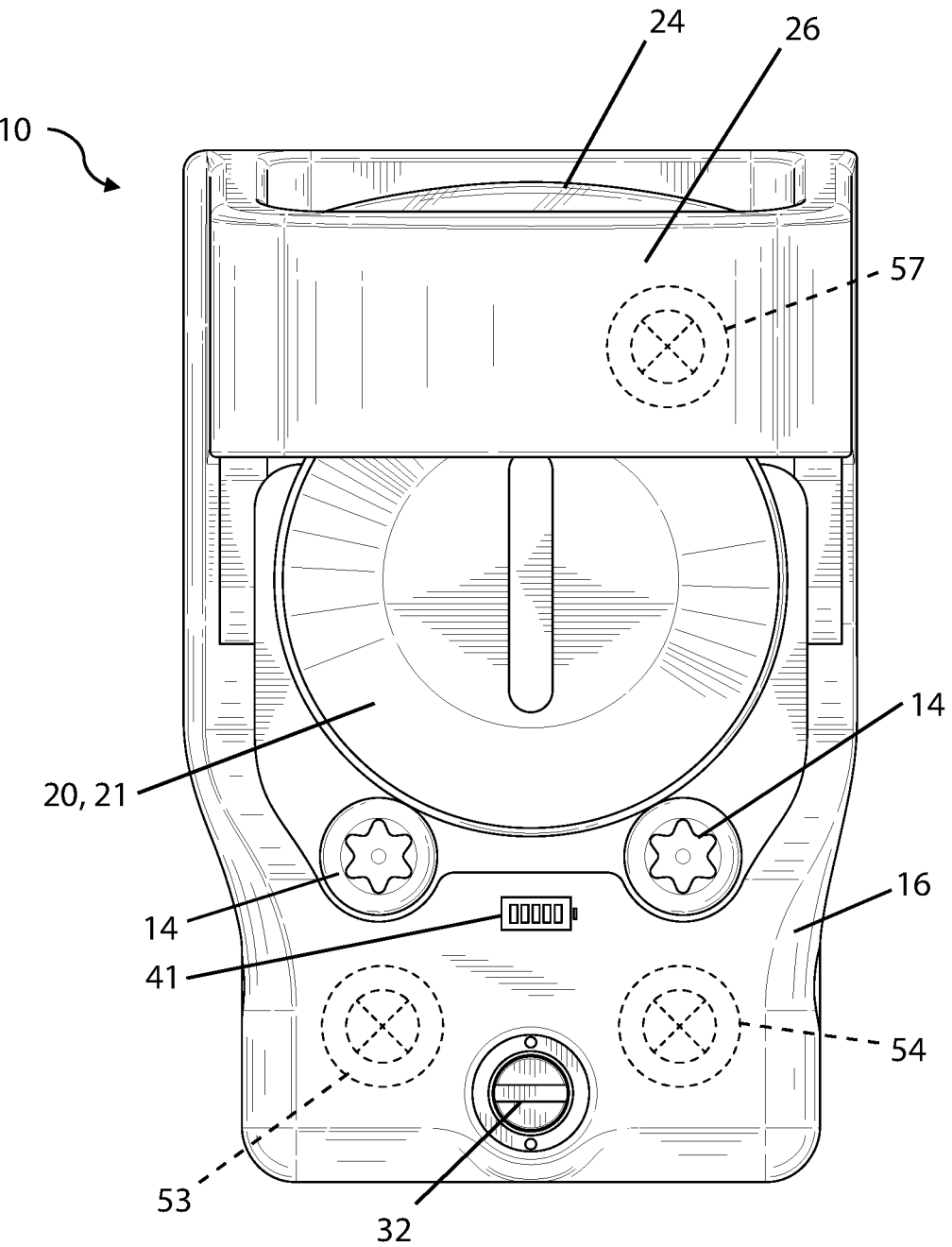
FIG. 3 is a top perspective view of the weapon sight according to the present disclosure.

FIG. 3 illustrates a further alternative where Hall effect sensors 53, 54 are provided along a top surface of the body 16. As a further alternative, one or more sensors 57 may be disposed on a top surface of the frame 26. Similarly to the sensors 51, 52 provided on a side of the body 16, the sensors 53, 54, may be associated with the adjustment of a user-selectable feature in place of or in combination with other sensors 50, 51, 52. In one example, the sensor 50 on a first side of the body 16 operates to activate an operational mode for adjusting user-selectable features, the sensors 51, 52 allow for the adjustment of a brightness profile and the sensors 53, 54 provide for the adjustment of the reticle design. The sensor 50 may active an operational mode for adjusting azimuth or elevation placement of reticle image. For example, sensors 51, 52 may be associated with one of the azimuth placement or the elevation placement, and the sensors 53, 54 may be associated with the other of the elevation placement or the azimuth placement. Any single sensor or combination of sensors can be placed in any one or more locations as described herein, such placement and combination selection is not intended to be limiting. The controller 38 may be arranged with any of the functions described herein to be associated with any one or more of the sensor placements, such function assignment described herein is not intended to be limiting.

Figure 4:
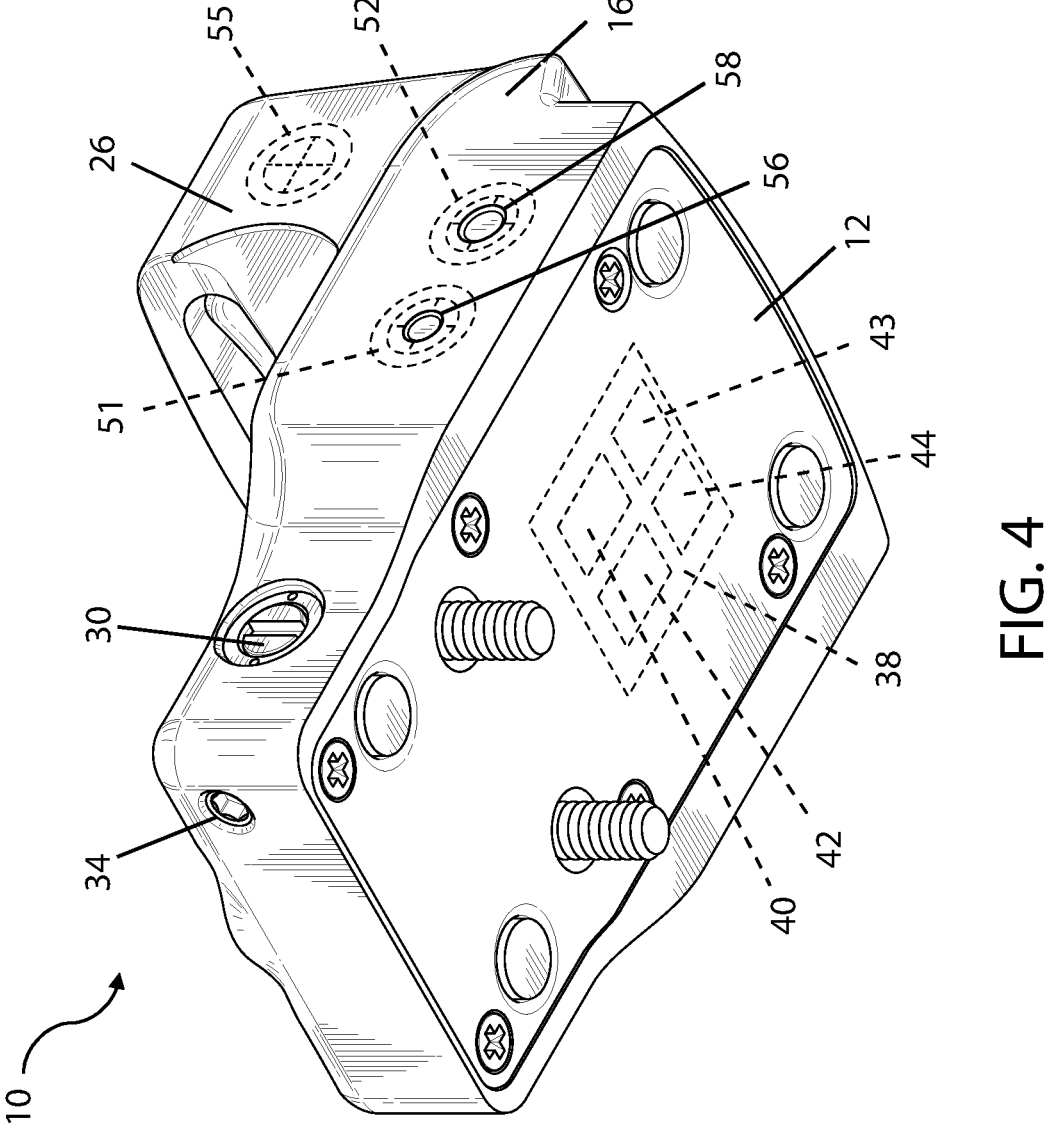
FIG. 4 is a bottom perspective view of the weapon sight according to the present disclosure.

FIG. 4 illustrates an implementation of the present disclosure further including a recess 56, such as a dimple or depression, which is formed in the surface of the body 16 aligned with a location of the sensor 51. A second recess 58 is aligned with a location of the second sensor 52. The recesses 56, 58 may provide a tactile indication to a user for where to dispose the magnet to provide an input to the associated sensors 51, 52. In other alternatives, visual indicators, such as a color, pattern, or symbol, may be disposed on the body 16 to indicate the location of the sensors 51, 52. Still further alternatives may include a textured surface portion, such as via surface roughening, stippling, knurling or the like, aligned with the sensor location. Other alternatives may combine elements of recesses 56, 58 in the body 16 with visual indicators and surface texturing to provide an indication of the sensor location to the user. The recesses 56, 58, visual indicators, or surface textures may be different between the sensor locations 51, 52 and may indicate the proper polarity for the magnetic input as the specific location 51, 52. Although not illustrated in the figures, such location designations as recesses, textured areas, or visual colors, patterns, or symbols may be associated with any one or more of the sensor placements on the sides or top of the body 16, or the sides or top of the frame 26.

Figure 9:
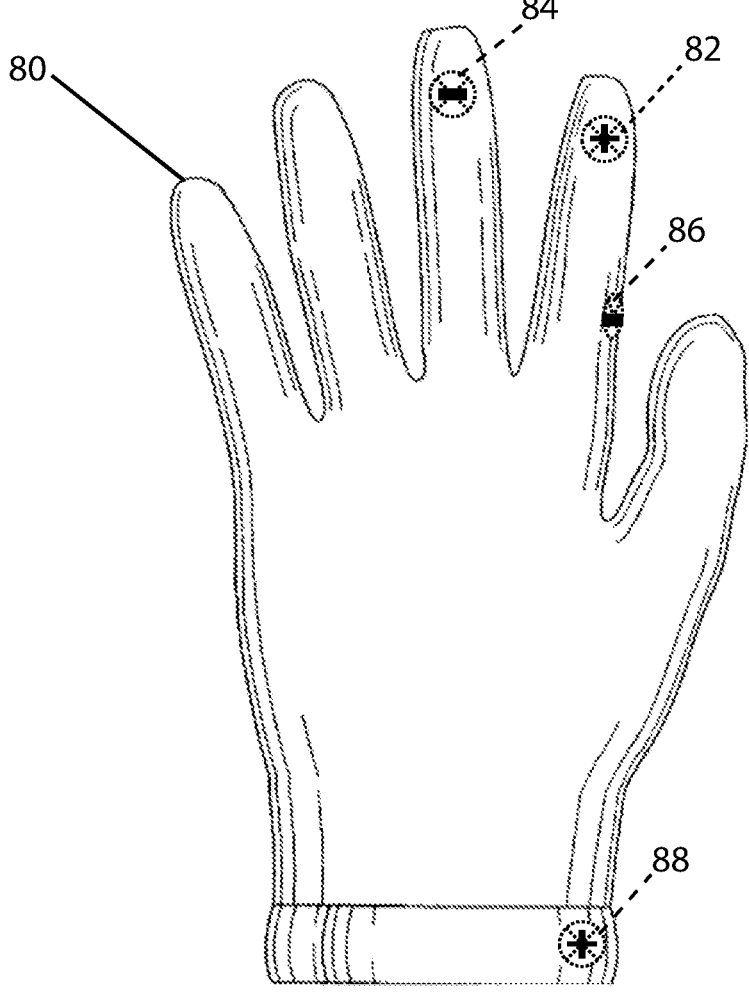
FIG. 9 is a third exemplary magnetic input tool as a glove for use with the weapon sight of the present disclosure.

A weapon sight system includes a weapon sight 10 having a Hall effect sensor, as described above in various alternatives in connection with FIGS. 1-4 and a magnetic input tool for providing a user input to the weapon sight. FIGS. 7-9 illustrate exemplary input devices to provide user input to the Hall effect sensors 50, 51, 52, 53, 54, 55, 57. The controller 38 may be programmed to read an input at a Hall effect sensor based on the strength, duration, or polarity of the magnetic field present at the Hall effect sensor. For example the processor may not read an input at a sensor until the strength of the magnetic field is higher than a predefined threshold. The magnetic field strength may be achieved only when a magnetic input tool is placed in close enough proximity to the sensor, such as when the magnetic input tool is placed in contact with the body 16 or frame 26 proximate to the sensor location.

The controller 38 may also be programmed to discriminate different inputs based on the duration over which the magnetic field is present. That is, the controller may be arranged to differentiate inputs for a short-time swipe of the magnetic input tool, a medium time swipe or a long duration swipe. For example, placing the magnetic input tool in proximity to the sensor for a brief time may be read as a different input as when the magnetic input tool is placed in proximity to the sensor and allowed to dwell for a time. In one example implementation, a short time swipe may toggle between user adjustable parameters, such as brightness and reticle selection, while a long time swipe may toggle between different values within the parameter, such as toggling between low brightness and high brightness, or between available reticle shapes. The short time swipe may be, for example, when the magnetic input tool is present near the Hall Effect sensor for less than about one tenth to one half of one second, and a long time swipe may be when the magnetic input tool is present near the Hall effect sensor for longer than one half to one second. Other suitable time values may be employed to differentiate swipes between short, long, or additional gradations of time.

FIG. 7 illustrates a first exemplary magnetic input tool or device as a stylus 60. The stylus 60 includes a first end tip 62 having a first magnetic field orientation, designated as a positive polarity, with a first end size and/or shape, and a second end tip 64 having a second magnetic field orientation, designated as a negative polarity, with a second end tip size and/or shape different from the first end tip 62 size and/or shape. The first end tip 62 size and second end tip size 64 may be selected to correspond to differently sized recesses 56, 58 so that a user can correctly orient and position the stylus 60 relative to the weapon sight 10 for providing a desired input. The strength of the field generated by the respective first end tip 62 and the second end tip 64, and the defined signal strength threshold for the associated sensor may correspond such that the controller 38 does not register an input signal unless the first end tip 62 or the second end tip 64 is positively disposed within the respective recess for the associated sensor. An alternative design contemplates a single-ended stylus where the weapon sight 10 has polarity-agnostic sensor(s).

FIG. 8 illustrates a second exemplary magnetic input tool as a fob 70. The fob 70 may include one or more magnets 72 proximate to an outer surface for placing in proximity to the weapon sight 10. The fob 70 may be arranged to expose a first magnetic polarity along a first side of the fob 70 and an opposite magnetic polarity along the opposite side of the fob 70. The user may place the fob 70 in proximity to the weapon sight 10 in a first orientation to provide input to a first sensor via a first magnetic polarity and in an opposite orientation to provide input to a second sensor via a second opposite magnetic polarity. The fob 70 may include a surface mark 74 or indication to indicate to the user which side of the fob 70 is associated with which magnetic polarity. For example, where the sensors on the weapon sight 10 are indicated with a first color for a first sensor associated with a first magnetic polarity, the fob 70 may have a first side marked with the same first color associated with the same magnetic polarity. Other visual indicators, such as symbols, patterns, or textures may be employed.

FIG. 9 illustrates a third exemplary magnetic input tool as glove 80. The glove 80 may integrate one or more magnets into a structure of the glove 80. In one example, a first magnet 82 is disposed at the pad of a first finger with a first polar orientation and a second magnet 84 is disposed at the pad of a second finger with a second polar orientation, opposite the first. According to the illustrated example, a user is able to interact with the weapon sight 10 while wearing the glove 80 as though buttons were provided on the body 16, with the sensors reading one, the other, or both of the magnets 82, 84 by the sensors. In other alternatives, magnets 86, 88 may be integrated into other locations of the glove 80. The magnets may be arranged in separated pairs having opposite polarity so as to avoid an unintentional input to the weapon sight 10. Although illustrated as a glove 80, the magnetic input tool may be formed as another wearable articles, such as a wristband, finger ring, or the like.

Figure 10:
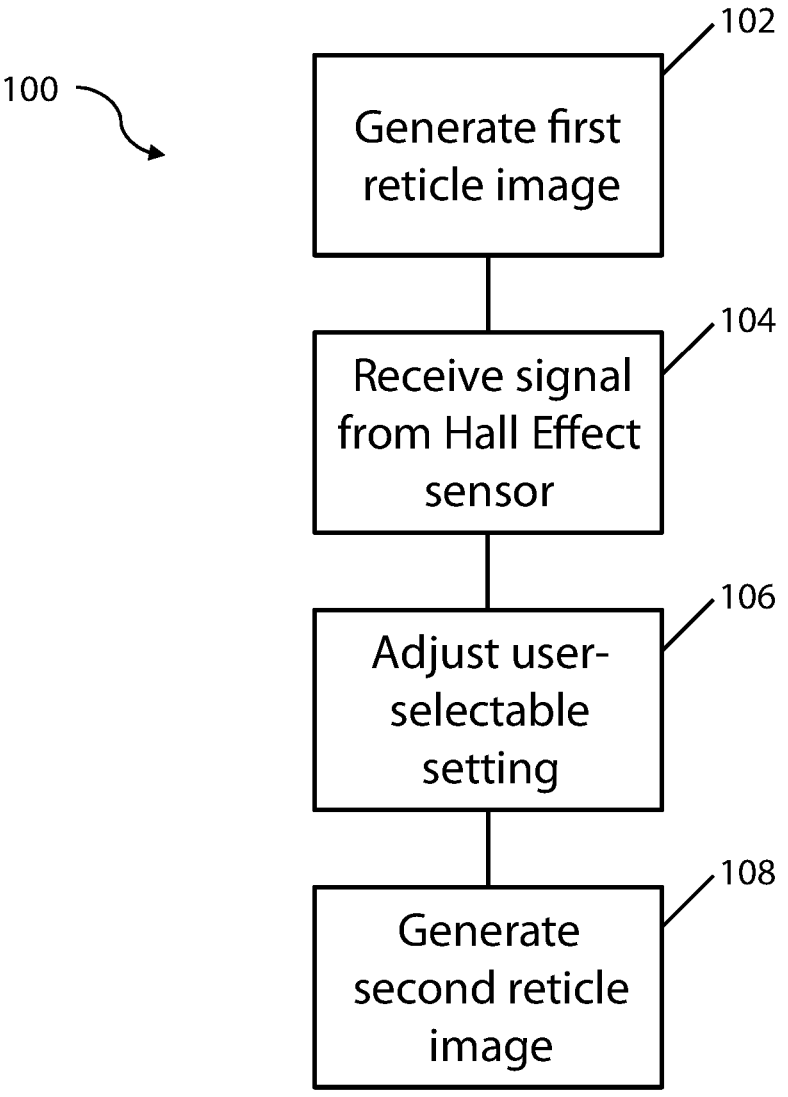
FIG. 10 is a flowchart of a method of controlling a weapon sight having a Hall effect sensor according to the present disclosure.

A method 100 of controlling a weapon sight having a Hall effect sensor is illustrated in FIG. 10 and includes a first step 102 of generating, by a controller in electronic communication with a light source, a first reticle image at an optical element, the first reticle image having a first reticle design illuminated at first brightness value according to a brightness profile. The method 100 includes at second step 104 of receiving, by the controller, an input signal generated by the Hall effect sensor representing a user input as the presence of a magnet proximate the Hall effect sensor of the weapon sight. The method 100 includes at third step 106 of adjusting a user-selectable setting in response to receiving the input signal generated by the Hall Effect sensor, wherein the user-selectable setting includes one of: a brightness setting; a reticle design setting; an azimuth adjustment setting; an elevation adjustment setting; or combinations thereof. The method 100 includes a fourth step 108 of generating a second reticle image, different from the first reticle image, by at least the changed user-selectable setting from step 106 in one or more of a brightness setting; a reticle design setting; an azimuth adjustment setting; an elevation adjustment setting; or combinations thereof.

The method 100 may include a step of receiving an signal to toggle an operational mode. For example, the method may include receiving the mode signal from the Hall effect sensor to enter an adjustment mode in which user-selectable settings can be adjusted. The mode signal from the Hall effect sensor to toggle or enter the adjustment mode may reflect a first input type, such as from a first Hall effect sensor or representative of a first swipe type, e.g., a long swipe, and where the mode signal is different from the input signal. The method may include, receiving the mode signal prior to receiving the input signal. The mode signal may be from the same first Hall effect sensor but representing a different swipe type, e.g., a short swipe for a mode input and a long swipe for an input signal; or the mode signal may be from a second Hall effect sensor different from the first Hall effect sensor receiving the input signal. The other operational modes described above may be toggled upon receiving an input signal from a particular Hall effect sensor, or upon receiving a particular type of input. For example, toggling a self-destruct operational mode may require a long swipe input of greater than about 5 or 10 seconds. This is not intended to be limiting and other configurations of multiple Hall effect sensors or multiple swipe input types on one or more Hall effect sensors are contemplated within the scope of the present disclosure.

The method 100 may include a step of generating an input confirmation. For example, the method may include providing a feedback response by flashing the reticle image in a pattern of flashes corresponding to different user-selectable settings available for adjustment or representing parameter values within the user-selectable setting. For example, the method may include flashing the reticle image a number of time associated with a brightness profile index. The method may include providing a feedback response such an audible alert or a visible alert unassociated with the reticle image, such as an LED indicator.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional implementations that also incorporate the recited features. Numbers, percentages, ratios, or other values stated herein are intended to include that value, and also other values that are "about" or "approximately" the stated value, as would be appreciated by one of ordinary skill in the art encompassed by implementations of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

Also for purposes of this disclosure, the terms "approximately," "about," and "substantially" as used herein represent an amount close to the stated amount that still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, the terms "upper," "lower," "right," "left," "rear," "front," "vertical," "horizontal," "distal," "proximal" and derivatives thereof shall relate to the orientation shown in FIG. 1. However, it is to be understood that various alternative orientations may be provided, except where expressly specified to the contrary. It is also to be understood that the specific devices and processes illustrated in the attached drawings, and described in this specification are simply exemplary embodiments of the inventive concepts defined in the appended claims. Hence, specific dimensions and other physical characteristics relating to the embodiments disclosed herein are not to be considered as limiting, unless the claims expressly state otherwise.

Changes and modifications in the specifically described embodiments may be carried out without departing from the principles of the present invention, which is intended to be limited only by the scope of the appended claims as interpreted according to the principles of patent law. The disclosure has been described in an illustrative manner, and it is to be understood that the terminology which has been used is intended to be in the nature of words of description rather than of limitation. Many modifications and variations of the present disclosure are possible in light of the above teachings, and the disclosure may be practiced otherwise than as specifically described.

The invention claimed is:

1. A weapon sight comprising:
   a body;
   a controller enclosed within the body;
   a power source in electronic communication with the controller and enclosed within the body;
   a light source in electronic communication with and controlled by the controller, the light source disposed within the body and operable to generate a reticle image;
   a frame extending from the body;
   an optical element, the optical element supported within the frame and arranged to visually display the reticle image and being one of reflective or holographic; and
   a Hall effect sensor in electronic communication with the controller, the Hall effect sensor arranged to generate an input signal in response to a magnet of an input tool coming into proximity to the Hall effect sensor;
   wherein the controller is operable to adjust a user-selectable setting associated with the reticle image in response to receiving the input signal generated by the Hall effect sensor, wherein the user-selectable setting is one of: a brightness profile setting, a reticle design setting, an azimuth adjustment setting, an elevation adjustment setting, or combinations thereof; and
   wherein the input tool is separate from the weapon sight.

2. The weapon sight of claim 1, further comprising an ambient light sensor in electronic communication with the controller and arranged to generate a brightness signal representative of an ambient light condition, wherein the controller is arranged to control a brightness of the light source based on the brightness signal generated by the ambient light sensor.

3. The weapon sight of claim 2, wherein the user-selectable setting is the brightness profile setting, wherein the controller comprises a memory device storing a plurality of user-selectable brightness profiles; the controller being operable to adjust among the plurality of user-selectable brightness profiles based on the input signal; and wherein the reticle image is based on a combination of a one of the user-selectable brightness profiles and the brightness signal.

4. The weapon sight of claim 3, wherein the plurality of user-selectable brightness profiles comprises a first brightness profile for use under natural sunlight, a second brightness profile for use indoors, and a third brightness profile for use in low-light conditions.

5. The weapon sight of claim 1, wherein the user-selectable setting comprises the reticle design setting.

6. The weapon sight of claim 5, wherein the controller comprises a memory device storing a plurality of user-selectable reticle designs, the plurality of user-selectable reticle designs comprises a dot, a starburst, a crosshair with center dot, and a circle with center dot.

7. The weapon sight of claim 1, wherein the Hall effect sensor is disposed adjacent an internal surface of a side wall of the body.

8. The weapon sight of claim 1, wherein the Hall effect sensor is disposed on a side of the frame.

9. A weapon sight system comprising:
   a weapon sight comprising
      a body;
      a controller enclosed within the body;

a light source enclosed within the body and in electronic communication with the controller, the controller being arranged to control the light source to generate a reticle image; and a Hall effect sensor disposed within the weapon sight and in electronic communication with the controller;

wherein the weapon sight comprises a recess formed proximate the Hall effect sensor; and a magnetic input tool, the magnetic input tool including a tip shaped to correspond to the recess, the tip including a magnet;

wherein the Hall effect sensor is arranged to generate an input signal when the tip of the magnetic input tool is received in the recess; and wherein the controller is operable to adjust a user-selectable setting associated with the reticle image in response to receiving the input signal generated by the Hall effect sensor.

10. The weapon sight system of claim 9, further comprising an ambient light sensor in electronic communication with the controller and arranged to generate a brightness signal representative of an ambient light condition, wherein the controller is arranged to control a brightness of the light source based on the brightness signal generated by the ambient light sensor.

11. The weapon sight system of claim 10, wherein the controller comprises a memory device storing a plurality of user-selectable brightness profiles; the controller being operable to adjust among the plurality of user-selectable brightness profiles based on the input signal; and wherein the reticle image is based on a combination of a one of the user-selectable brightness profiles and the brightness signal.

12. The weapon sight system of claim 9, wherein the user-selectable setting comprises a reticle design.

13. The weapon sight system of claim 12, wherein the controller comprises a memory device storing a plurality of user-selectable reticle designs, the plurality of user-selectable reticle designs comprises a dot, a starburst, a crosshair with center dot, and a circle with center dot.

14. The weapon sight system of claim 9, wherein the magnetic input tool comprises a stylus, wherein the tip is a first tip, the magnet is a first magnet at a first orientation, and the input signal is a first input signal, wherein the stylus further comprises a second tip, the second tip comprising a second magnet at a second orientation different from the first orientation.

15. The weapon sight system of claim 14, wherein the weapon sight comprises a second Hall sensor, the weapon sight further comprising a second recess proximate the second Hall effect sensor, the second tip shaped to correspond to the second recess, wherein the second Hall effect sensor is arranged to generate a second input signal when the second tip of the magnetic input tool is received in the second recess; and wherein the controller is operable to adjust the user-selectable setting associated with the reticle image in response to receiving the second input signal generated by the second Hall effect sensor, different from the first input signal.

16. A method for controlling a weapon sight having a Hall effect sensor, the method comprising:

generating, by a controller in electronic communication with a light source, a first reticle image at an optical element, the first reticle image having a first reticle design, a first brightness profile, a first azimuth setting and a second elevation setting;

receiving, by the controller, an input signal generated by the Hall effect sensor, the input signal representing a user input presenting a magnet in proximity to the Hall effect sensor, the magnet being of an input tool that is separate from the weapon sight;

adjusting, by the controller, a user-selectable setting in response receiving the input signal generated by the Hall effect sensor, wherein the user-selectable setting is one of: a brightness profile setting, a reticle design setting, an azimuth adjustment setting, an elevation adjustment setting, or combinations thereof; and generating, by the controller, a second reticle image, different from the first reticle image by the adjusted user-selectable setting.

17. The method of claim 16, further comprising receiving, by the controller, a mode signal to toggle an adjustment mode for adjusting the user-selectable setting.

18. The method of claim 17, wherein the input signal is based on a first swipe type and the mode signal is based on a second swipe type.

19. The method of claim 16, wherein the Hall effect sensor is a first Hall effect sensor for generating the input signal; and wherein the weapon sight comprises a second Hall effect sensor for generating a mode signal.

20. The method of claim 16, further comprising generating, with the controller, an input confirmation, wherein the input confirmation comprises one of a visual alert, an audible alert, and a combination of visual alert and audible alert.

* * * * *